(12) United States Patent
Ozeki et al.

(10) Patent No.: US 8,102,025 B2
(45) Date of Patent: Jan. 24, 2012

(54) SEMICONDUCTOR DEVICE HAVING IGBT AND DIODE

(75) Inventors: Yoshihiko Ozeki, Nukata-gun (JP); Norihito Tokura, Okazaki (JP); Yukio Tsuzuki, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 76 days.

(21) Appl. No.: 11/709,272

(22) Filed: Feb. 22, 2007

(65) Prior Publication Data

US 2007/0200138 A1 Aug. 30, 2007

(30) Foreign Application Priority Data

Feb. 24, 2006 (JP) .................................. 2006-49300

(51) Int. Cl.
*H01L 29/66* (2006.01)

(52) U.S. Cl. ......... 257/577; 257/E27.022; 257/E27.037; 438/328

(58) Field of Classification Search .................. 257/565, 257/577, E27.019, E27.022, E27.037; 438/328
See application file for complete search history.

(56) References Cited

U.S. PATENT DOCUMENTS

| | | | | |
|---|---|---|---|---|
| 5,162,876 A * | 11/1992 | Kitagawa et al. | .............. | 257/138 |
| 5,360,984 A * | 11/1994 | Kirihata | ......... | 257/143 |
| 5,859,446 A | 1/1999 | Nagasu et al. | | |
| 6,031,254 A * | 2/2000 | Quoirin | ......... | 257/155 |
| 6,177,713 B1 | 1/2001 | Aono et al. | | |
| 6,222,248 B1 * | 4/2001 | Fragapane | ......... | 257/565 |
| 6,271,545 B1 * | 8/2001 | Schulze | ......... | 257/107 |
| 6,307,231 B1 * | 10/2001 | Numazawa et al. | ......... | 257/330 |
| 6,605,830 B1 * | 8/2003 | Kusunoki | ......... | 257/156 |
| 6,639,295 B2 * | 10/2003 | Majumdar et al. | ......... | 257/506 |
| 7,112,868 B2 * | 9/2006 | Willmeroth et al. | ......... | 257/578 |
| 7,400,017 B2 * | 7/2008 | Aono et al. | ......... | 257/370 |
| 2002/0113247 A1 * | 8/2002 | Magri et al. | ......... | 257/133 |
| 2005/0035405 A1 * | 2/2005 | Mauder et al. | ......... | 257/341 |
| 2008/0290403 A1 * | 11/2008 | Ono et al. | ......... | 257/329 |
| 2009/0242931 A1 * | 10/2009 | Tsuzuki et al. | ......... | 257/143 |

FOREIGN PATENT DOCUMENTS

| | | |
|---|---|---|
| JP | A-2000-114550 | 4/2000 |
| JP | 2000200909 A * | 7/2000 |
| JP | A-2000-340806 | 12/2000 |
| JP | A-2002-270857 | 9/2002 |

OTHER PUBLICATIONS

Office Action dated Sep. 24, 2008 in corresponding German patent application No. 10 2007 008 568.2-33 (and English translation).
Office Action dated Sep. 5, 2008 in corresponding Chinese patent application No. 2007100789830 (and English translation).

* cited by examiner

*Primary Examiner* — William F Kraig
(74) *Attorney, Agent, or Firm* — Posz Law Group, PLC

(57) ABSTRACT

A semiconductor device includes: a semiconductor substrate; a IGBT region including a first region on a first surface of the substrate and providing a channel-forming region and a second region on a second surface of the substrate and providing a collector; a diode region including a third region on the first surface and providing an anode or a cathode and a fourth region on the second surface and providing the anode or the cathode; a periphery region including a fifth region on the first surface and a sixth region on the second surface. The first, third and fifth regions are commonly and electrically coupled, and the second, fourth and sixth regions are commonly and electrically coupled with one another.

27 Claims, 11 Drawing Sheets

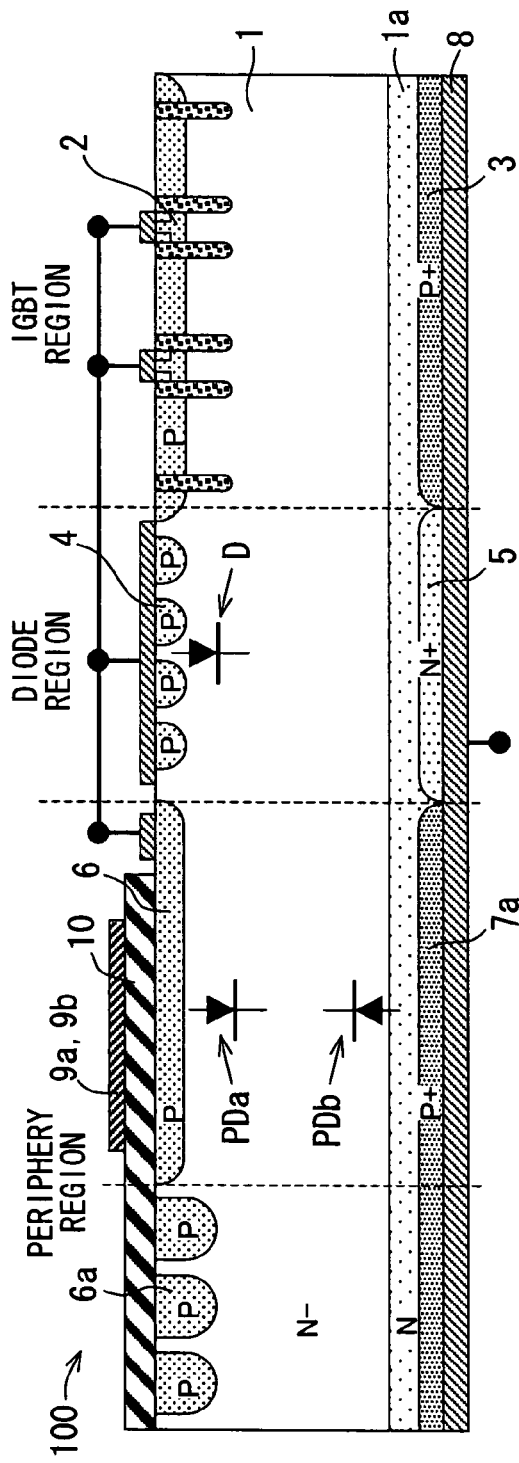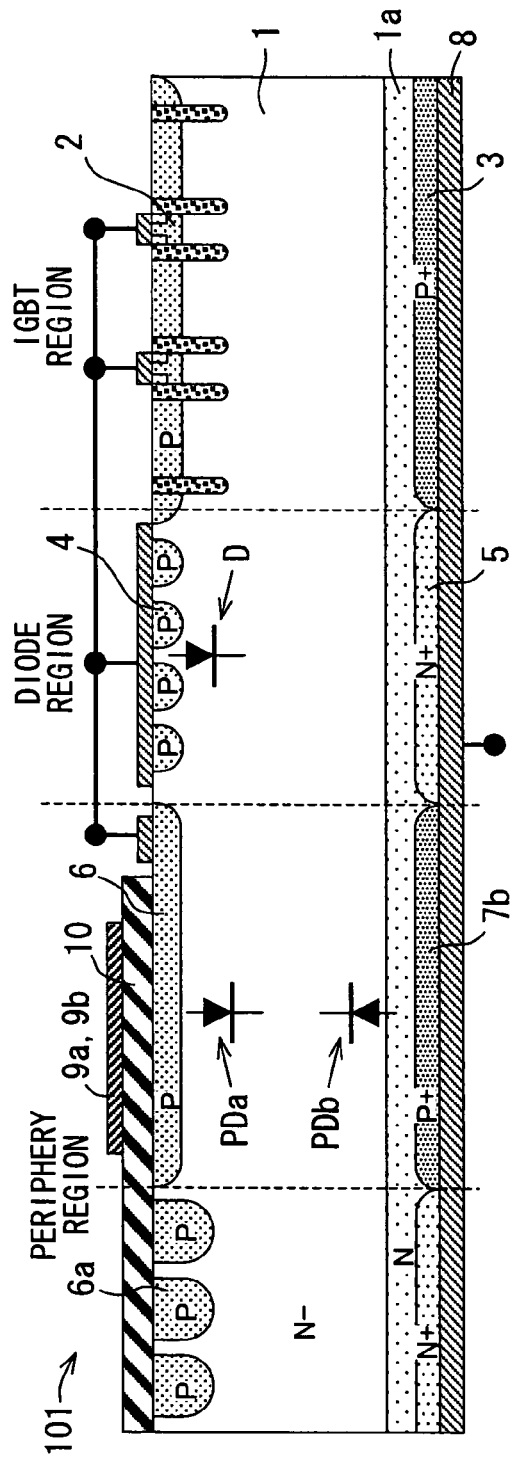

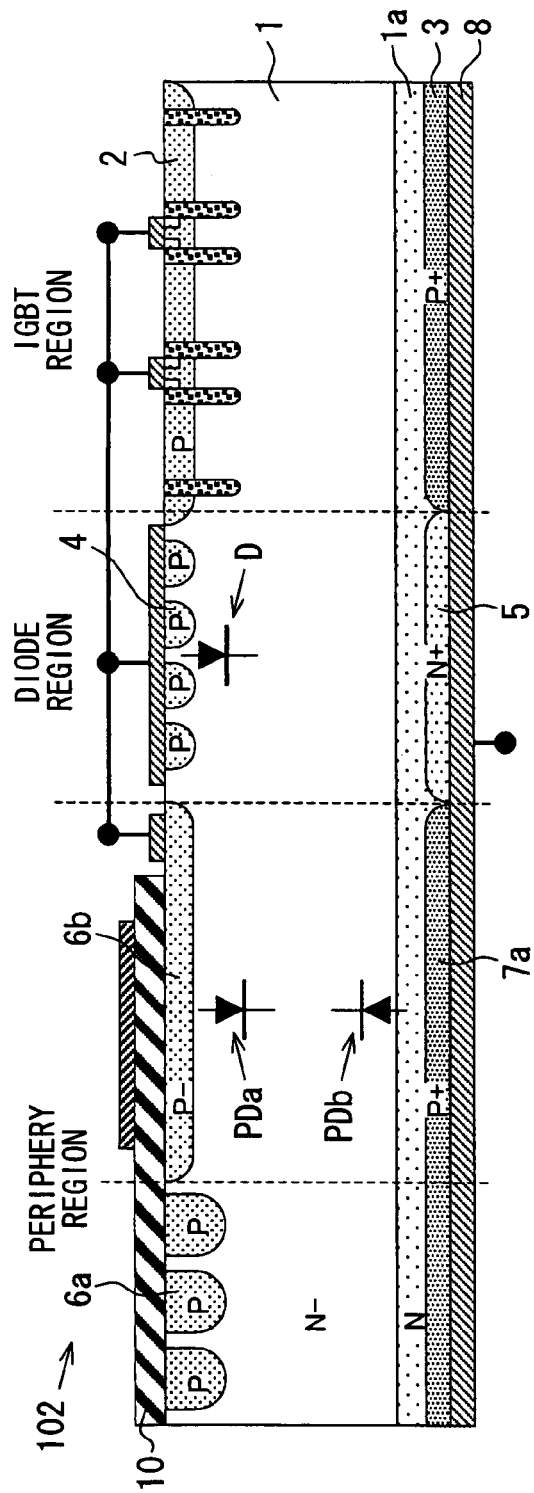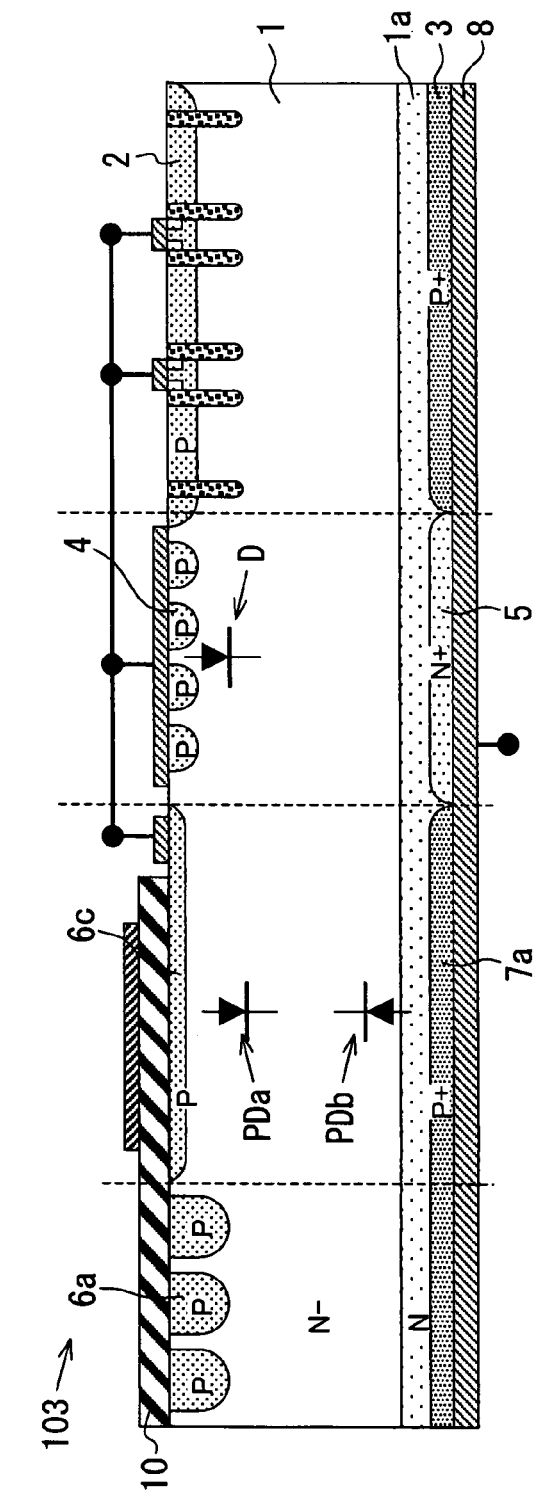

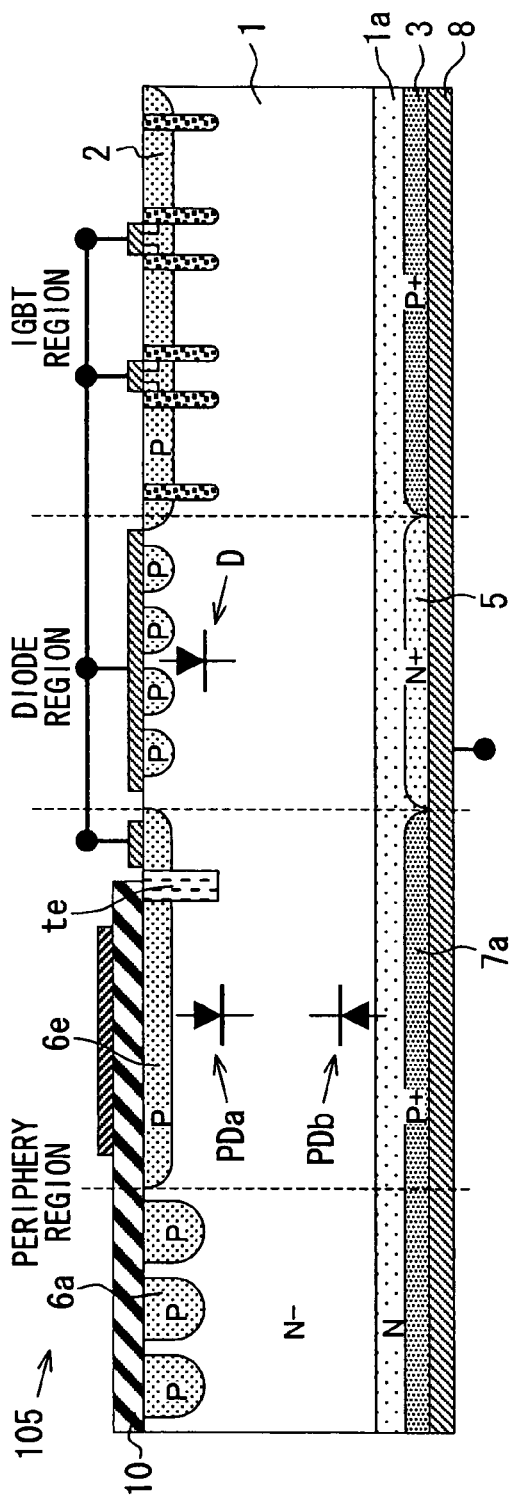
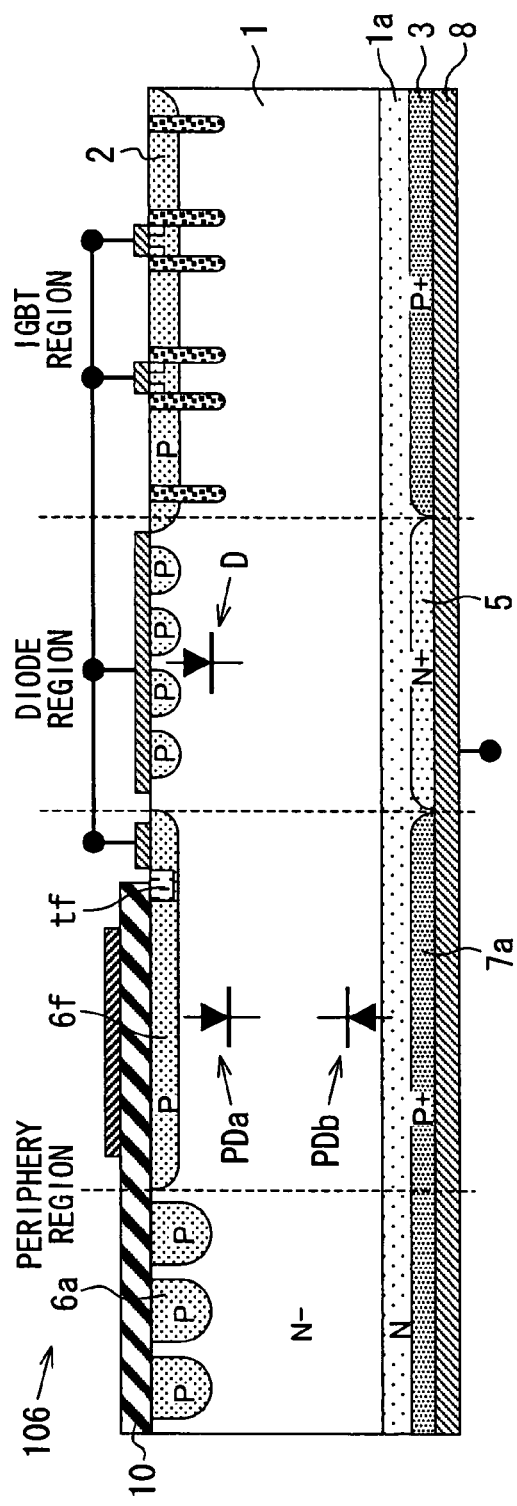

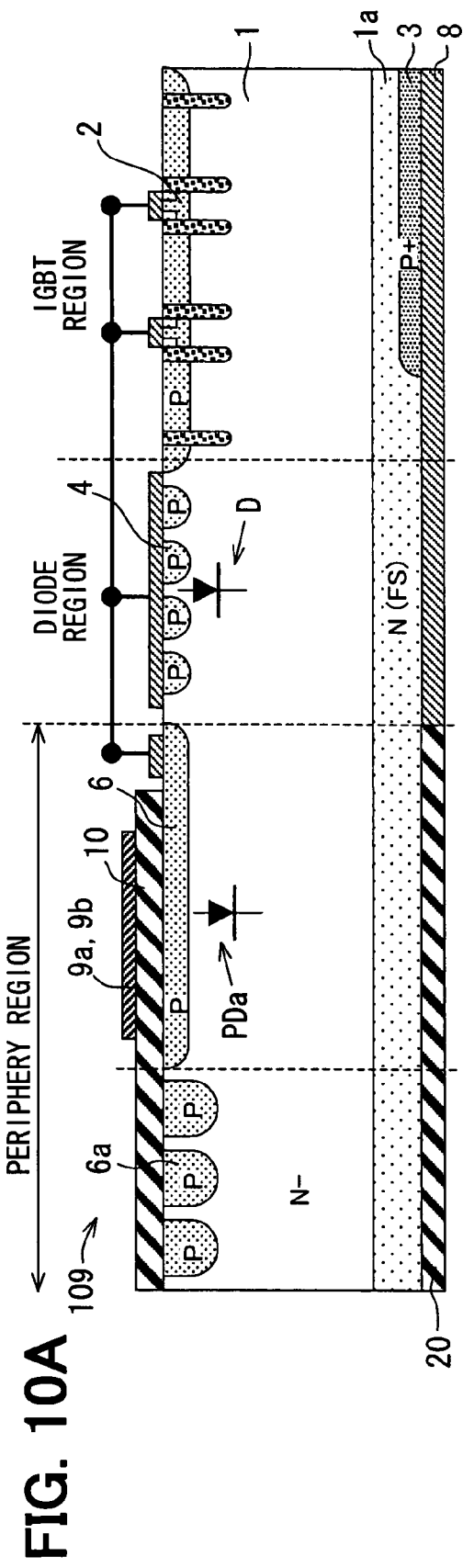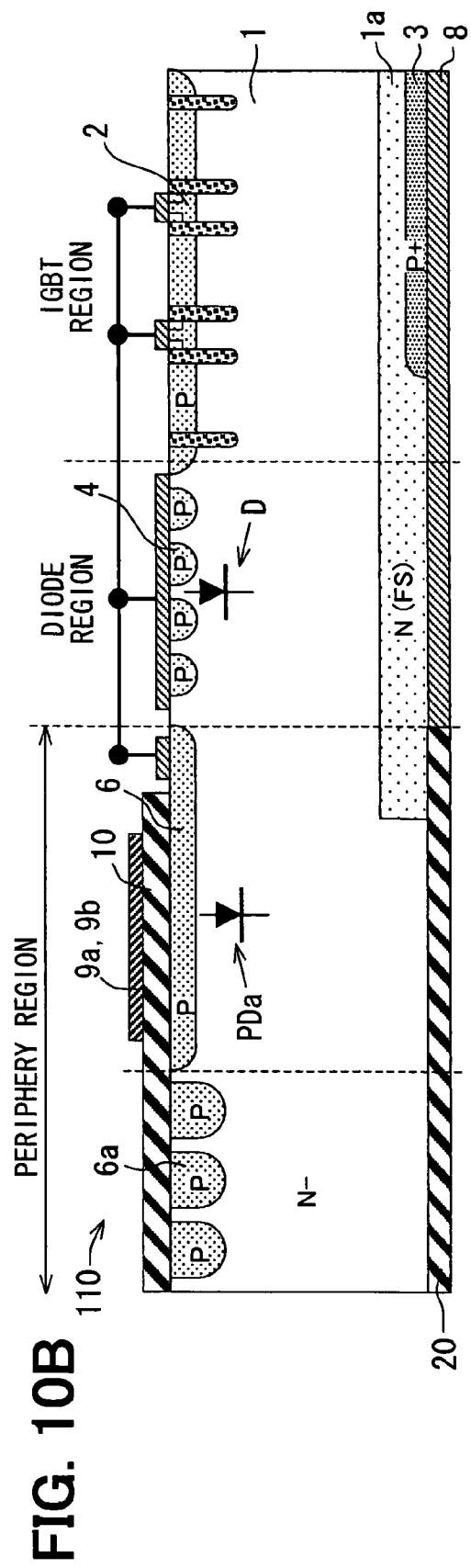

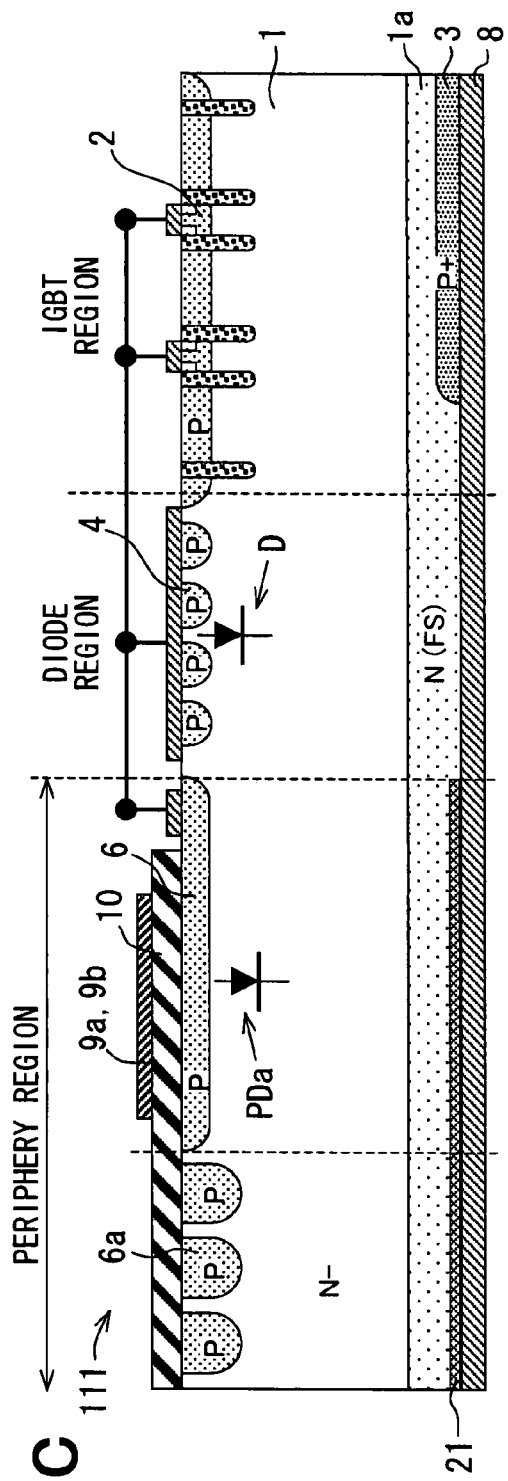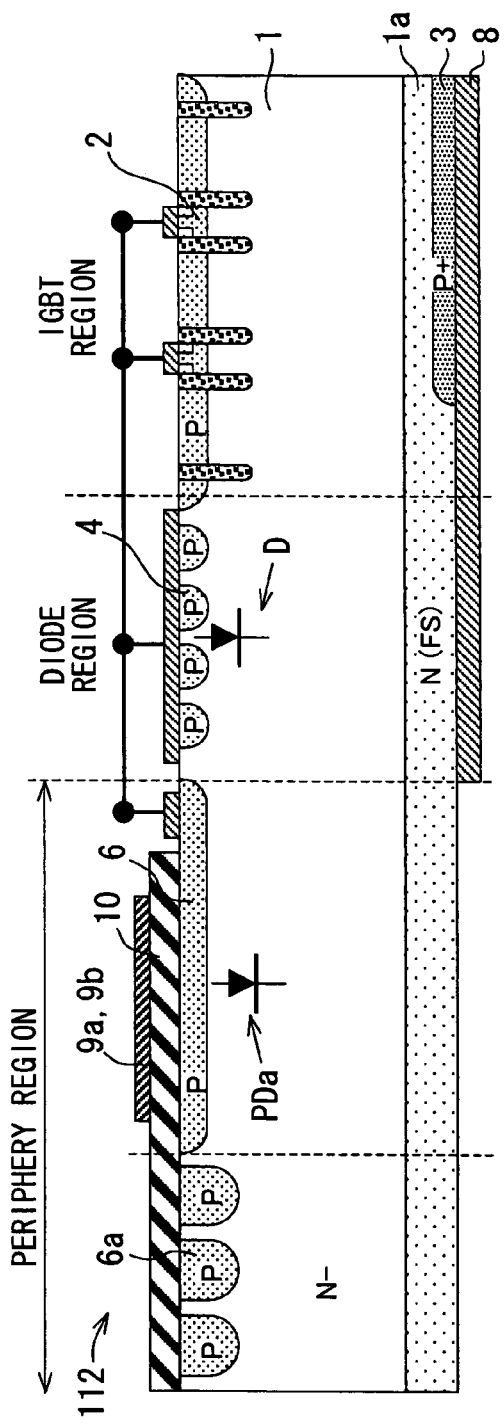

US 8,102,025 B2

SEMICONDUCTOR DEVICE HAVING IGBT AND DIODE

CROSS REFERENCE TO RELATED APPLICATION

This application is based on Japanese Patent Application No. 2006-49300 filed on Feb. 24, 2006, the disclosure of which is incorporated herein by reference.

FIELD OF THE INVENTION

The present invention relates to a semiconductor device having an IGBT and a diode.

BACKGROUND OF THE INVENTION

An inverter circuit for driving a load such as a motor is an exchanger to switch a direct voltage and an alternating voltage so that the inverter energizes the motor. Specifically, the inverter circuit for driving an inductive motor is composed of, for example, a switching element such as an IGBT (i.e., insulated gate bipolar transistor) and a FWD (i.e., free wheel diode). The IGBT functions as the switching element. The FWD bypasses and refluxes the current flowing in the motor when the IGBT turns off so that the current flowing in the motor does not change even when the IGBT switches between an on-state and an off-state. Specifically, a direct current power source is coupled with the motor. The IGBT applies the voltage to the motor. When the TGBT turns off, the current flowing in the motor flows back through the FWD by the energy accumulated in an inductance L of the motor. Thus, the inverse direct current may be applied to the motor. Since the current in the motor is not blocked immediately when the IGBT switches to the off-state, the alternating voltage is substantially energized from the direct current power source. Since the inverter circuit functions the above operation, it is necessary for the circuit to have the FWD, which is inversely connected in series with the IGBT. Specifically, it is necessary for the FWD to connect inversely in parallel to the IGBT.

A diode used for the FWD is disclosed in U.S. Pat. No. 5,859,446, JP-A-2000-114550, U.S. Pat. No. 6,177,713, JP-A-2002-270857, and JP-A-2000-340806.

FIG. 7 shows a diode 89 disclosed in U.S. Pat. No. 5,859,446. In the diode 89, when the diode 89 intercepts a current, i.e., when the diode 89 is in an interception state, a depletion layer expands in a semiconductor layer 14 having a N$^-$ conductive type (i.e., a N$^-$ layer 14) so that the current does not flow. When a positive voltage is applied to an anode electrode in the diode 89 with reference to a cathode electrode 17, a hole is introduced from a semiconductor layer having a P$^+$ conductive type 11 (i.e., a P$^+$ layer 11) to the N$^-$ layer 14. Thus, the current flows through the diode 89. A semiconductor layer 12 having the P$^+$ conductive type, which is partially formed in a termination region, expands the depletion layer from a junction J1 between the P$^+$ layer 11 and the N$^-$ layer 14 to a periphery of the diode 89 so that the semiconductor layer 12 prevents electric field concentration near a boundary of the termination region.

The termination region surrounds an active region and an inductance portion L. An insulation film 13 made of, for example, a SiO$_2$ film is partially formed near the surface of the termination region. A semiconductor layer 15 having a N$^+$ conductive type (i.e., a N$^+$ layer 15) is disposed on a cathode side surface of the N$^-$ layer 14. The N$^+$ layer 15 contacts the cathode electrode 17. The N$^+$ layer 15 introduces an electron into the N$^-$ layer 14 when a forward voltage is applied to the diode 89.

FIG. 8 is an equivalent circuit diagram showing a semiconductor device 90 suitably used for an inverter circuit of driving the load such as the motor. The device 90 includes an IGBT 90$i$ and a diode 90$d$, which are inversely connected in parallel to each other.

In the device 90 according to a prior art, the IGBT 90$i$ and the diode 90$d$ are formed in different semiconductor substrates or different semiconductor chips, respectively. However, it is preferred that the IGBT 90$i$ and the diode 90$d$ are formed in the same semiconductor substrate in order to minimize the dimensions of the device.

When the diode 90$d$ is used for the FWD in the inverter circuit, a current waveform of the diode 90$d$ is important in a case where the diode 90$d$ is recovered inversely at a time when the diode 90$d$ switches from the on-state to the off-state.

FIG. 9A shows a circuit for measuring and evaluating a current waveform. Here, the current flows through the diode 90$d$ in the semiconductor device 90. FIG. 9B shows an example of the current waveform.

Semiconductor devices 90$a$, 90$b$ are provided by the device 90 shown in FIG. 8. An IGBT 90$ai$ in the device 90$a$ is used for the switching device, an IGBT in the device 90$b$ is shunted, and a current Id flowing through the diode 90$bd$ is measured.

As shown in FIG. 9B, when the IGBT 90$ai$ in the device 90$a$ turns off, a circulation current flows in the diode 90$bd$ of the device 90$b$. When the IGBT 90$ai$ turns on, an instantaneous current flows reversely in the diode 90$bd$. This instantaneous current has a peak, which is defined as a recovery current Irr. When the diode 90$bd$ recovers reversely, the power source voltage is applied to the diode 90$bd$. The product of the recovery current Irr and the voltage is defined as a recovery loss. In general, it is required for a rectifier diode to have a small recovery current Irr and a small recovery loss in case of a reverse recovery step. Further, it is required to have slow recovery of the current in case of the reverse recovery step. Thus, it is necessary to improve recovery characteristics of the diode 90$bd$.

SUMMARY OF THE INVENTION

In view of the above-described problem, it is an object of the present disclosure to provide a semiconductor device having an IGBT and a diode.

According to a first aspect of the present disclosure, a semiconductor device includes: a semiconductor substrate having a first conductive type and first and second surfaces; an IGBT region having an IGBT and disposed in the substrate; a diode region having a diode and disposed in the substrate; and a periphery region disposed in the substrate. The IGBT region includes: a first semiconductor region having a second conductive type and disposed in a surface portion of the first surface of the substrate, the first semiconductor region providing a channel-forming region of the IGBT; and a second semiconductor region having the second conductive type and disposed in a surface portion of the second surface of the substrate, the second semiconductor region facing the first semiconductor region and providing a collector of the IGBT. The diode region includes: a third semiconductor region having the second conductive type and disposed in a surface portion of the first surface of the substrate, the third semiconductor region providing one of an anode and a cathode of the diode; and a fourth semiconductor region having the first conductive type and disposed in a surface portion of the second surface of the substrate, the fourth semiconductor region facing the first semiconductor region and providing the other one of the anode and the cathode of the diode. The periphery region includes: a fifth semiconductor region having the second conductive type and disposed in a surface portion of the first surface of the substrate; and a sixth semiconductor region having the second conductive type and disposed in a surface portion of the second surface of the substrate, the sixth semiconductor region facing the fifth semiconductor region. The first, third and fifth semiconductor regions are commonly and electrically coupled with one another, and the second, fourth and sixth semiconductor regions are commonly and electrically coupled with one another.

In the above device, the sixth semiconductor region is disposed on the second surface of the substrate and faces the fifth semiconductor region. Thus, the parasitic diode around the sixth semiconductor region is oppositely disposed to the parasitic diode around the fifth semiconductor region. Thus, the influence of the parasitic diode around the fifth semiconductor region is reduced so that the hole is prevented from introducing into the substrate under the fifth semiconductor region in case of a forward operation. Accordingly, the recovery characteristics of the regular diode are improved in case of a reverse operation.

According to a second aspect of the present disclosure, a semiconductor device includes: a semiconductor substrate having a first conductive type and first and second surfaces; an IGBT region having an IGBT and disposed in the substrate; a diode region having a diode and disposed in the substrate; and a periphery region disposed in the substrate. The IGBT region includes: a first semiconductor region having a second conductive type and disposed in a surface portion of the first surface of the substrate, the first semiconductor region providing a channel-forming region of the IGBT; and a second semiconductor region having the second conductive type and disposed in a surface portion of the second surface of the substrate, the second semiconductor region facing the first semiconductor region and providing a collector of the IGBT. The diode region includes: a third semiconductor region having the second conductive type and disposed in a surface portion of the first surface of the substrate, the third semiconductor region providing one of an anode and a cathode of the diode; and a fourth semiconductor region having the first conductive type and disposed in a surface portion of the second surface of the substrate, the fourth semiconductor region facing the first semiconductor region and providing the other one of the anode and the cathode of the diode. The periphery region includes a fifth semiconductor region having the second conductive type and disposed in a surface portion of the first surface of the substrate. The IGBT region is disposed between the periphery region and the diode region. The first, third and fifth semiconductor regions are commonly and electrically coupled with one another, and the second and fourth semiconductor regions are commonly and electrically coupled with one another.

In the above device, the IGBT region is disposed between the periphery region and the diode region. Thus, even when the hole is introduced into the substrate under the fifth semiconductor region in case of a forward operation, the influence of the hole to the recovery characteristics of the diode is reduced in case of a reverse operation.

BRIEF DESCRIPTION OF THE DRAWINGS

The above and other objects, features and advantages of the present invention will become more apparent from the following detailed description made with reference to the accompanying drawings. In the drawings:

FIGS. 1A and 1B are cross sectional views showing semiconductor devices according to example embodiments of the present disclosure;

FIGS. 2A and 2B are cross sectional views showing semiconductor devices according to other example embodiments of the present disclosure;

FIGS. 4A and 4B are cross sectional views showing semiconductor devices according to other example embodiments of the present disclosure;

FIGS. 10A-10D are cross sectional views showing semiconductor devices according to other example embodiments of the present disclosure;

DETAILED DESCRIPTION OF THE PREFERRED EMBODIMENTS

Figure 3:
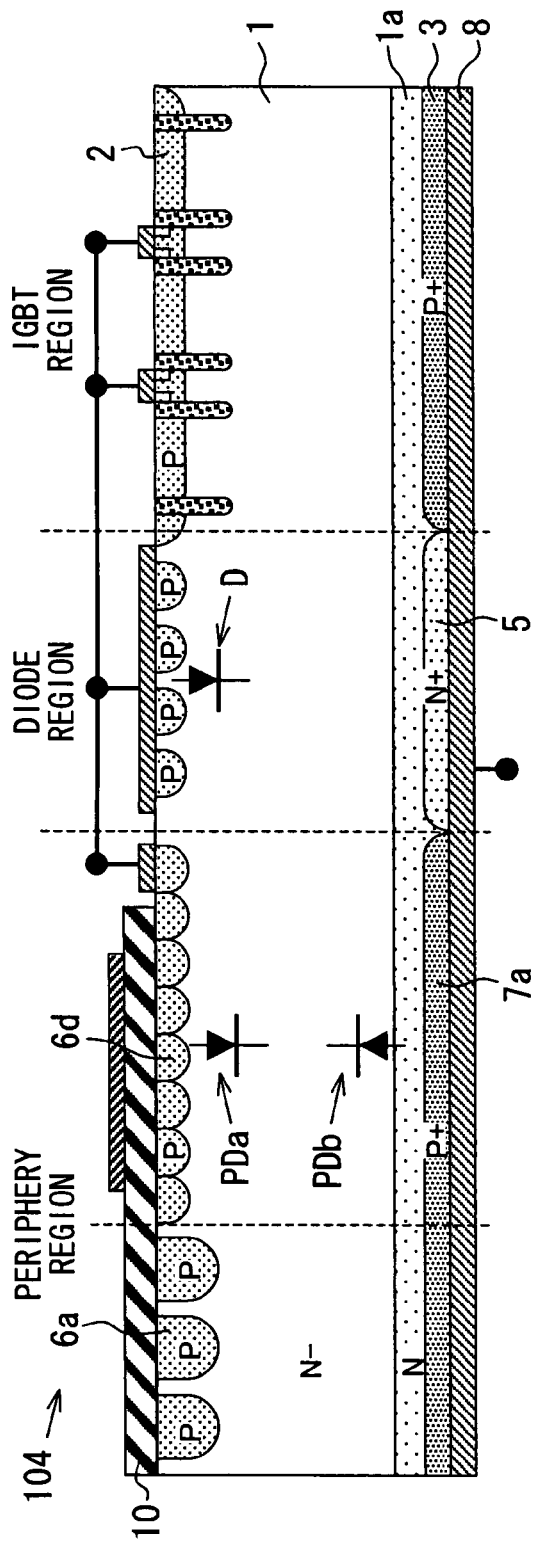
FIG. 3 is a cross sectional view showing a semiconductor device according to another example embodiment of the present disclosure.

FIGS. 1A and 1B show semiconductor devices 100, 101 according to example embodiments of the present disclosure. Specifically, each of FIGS. 1A and 1B shows a left side of the device 100, 101. In a center of each device 100, 101, an IGBT region and a diode region are alternately arranged. A right side of each device 100, 101 has a structure, which is a left-right reversed structure of FIG. 1A or 1B.

Each device 100, 101 includes a semiconductor substrate 1 having a N$^-$ conductive type, in which an IGBT and a diode are formed.

In the IGBT region of each device 100, 101, a first semiconductor region 2 having a P conductive type is formed in a surface portion of a principal surface of the semiconductor substrate 1. The first semiconductor region 2 provides a channel-forming region of the IGBT. A second semiconductor region 3 having a P$^+$ conductive type is formed in a surface portion of a backside surface of the substrate 1. The second semiconductor region 3 faces the first semiconductor region 2. The second semiconductor region 3 provides a collector region of the IGBT. A semiconductor layer 1a having a N conductive type and formed in the surface portion of the backside surface of the substrate 1 provides a field stop layer of the IGBT.

In the diode region of each device 100, 101, a third semiconductor region 4 having the P conductive type is formed in a surface portion of the principal surface of the substrate 1. The third semiconductor region 4 provides an anode region of the diode. A fourth semiconductor region 5 having a N+ conductive type is formed in a surface portion of the backside surface of the substrate 1. The fourth semiconductor region 5 faces the third semiconductor region 4. The fourth semiconductor region 5 provides a cathode region of the diode.

A periphery region in the substrate 1 is disposed on a periphery of the substrate 1, which is a region other than the IGBT region and the diode region. In the periphery region, a fifth semiconductor region 6 having the P conductive type is formed in a surface portion of the principal surface. The fifth semiconductor region 6 is disposed under a gate wiring 9a and a pad electrode 9b of the IGBT with an insulation film 10 between the region 6 and the wiring 9a or the electrode 9b. The fifth semiconductor region 6 and the substrate 1 provide a PN junction therebetween so that a breakdown voltage of the device is improved. The first, third and fifth semiconductor regions 2, 4, 6 are electrically coupled in common with one another. The fifth semiconductor region 6 is formed in the same forming step as the first and third semiconductor regions 2, 4. The fifth semiconductor region 6 has the same impurity concentration and the same depth as the first and third semiconductor regions 2, 4. A seventh semiconductor region 6a having the P conductive type is formed in a surface portion of the principal surface of the substrate 1. The seventh semiconductor region 6a surrounds the first, third and fifth semiconductor regions 2, 4, 6. The seventh semiconductor region 6a is not electrically connected to the fifth semiconductor region 6 so that the seventh semiconductor region 6a is electrically floated from the fifth semiconductor region 6. By using the seventh semiconductor region 6a, a depletion layer expands to the periphery region when the diode is in the interception state, compared with a case where the periphery region has no seventh semiconductor region 6a. Thus, the seventh semiconductor region 6a provides to reduce the electric field concentration.

In each device 100, 101, a sixth semiconductor region 7a, 7b having the P+ conductive type is disposed in a surface portion of the backside surface of the substrate 1. The sixth semiconductor region 7a, 7b faces the fifth semiconductor region 6. In the device 100, the sixth semiconductor region 7a is disposed on whole backside surface other than the second semiconductor region 3 and the fourth semiconductor region 5. In the device 101, the sixth semiconductor region 7b is only disposed under the fifth semiconductor region 6. The second, fourth and sixth semiconductor regions 3, 5, 7 are electrically and mutually coupled with a backside electrode 8.

In the device 100, 101, the IGBT region and the diode region are formed in the substrate 1, so that the dimensions of the device having the IGBT and the diode are minimized.

The fifth semiconductor region 6 of each device 100, 101 has the P conductive type, and is disposed under the gate wiring 9a and the pad electrode 9b. The fifth semiconductor region 6 provides to improve a breakdown voltage by forming a PN junction between the substrate 1 and the region 6. The fifth semiconductor region 6 is electrically coupled with the first and third semiconductor regions 2, 4. Accordingly, the device 100 has a regular diode D, and, in addition, the device 100 has two parasitic diodes PDa, PDb. The parasitic diode PDa is formed between the fifth semiconductor region 6 and the substrate 1 disposed under the fifth semiconductor region 6. If a N conductive type region facing the fifth semiconductor region 6 is disposed on the backside surface of the substrate 1, the parasitic diode PDa between the fifth semiconductor region 6 and the substrate 1 provides to introduce a large amount of holes into the substrate 1 in case of a forward operation. This hole introduction causes degradation of the recovery characteristics in the regular diode D in case of a reverse operation.

To avoid the above degradation of the recovery characteristics, in each device 100, 101, the sixth semiconductor region 7a, 7b having the P conductive type is formed on the backside surface of the substrate 1, and faces the fifth semiconductor region 6 disposed on the principal surface of the substrate 1. Thus, another parasitic diode PDb around the sixth semiconductor region 7a, 7b is formed on the backside of the substrate 1. The parasitic diode PDb has a direction opposite to the parasitic diode PDa around the fifth semiconductor region 6. Accordingly, the operation of the parasitic diode PDa is limited, and the hole introduction into the substrate 1 under the fifth semiconductor region 6 in case of the forward operation is reduced. The recovery characteristics of the regular diode D in case of the reverse operation are improved.

The parasitic diode PDa around the fifth semiconductor region 6 may be broken when the current change rate dI/dt of the recovery process becomes larger. This is similar to a case where a surge voltage such as an ESD (i.e., electro static discharge) is applied to the device. Accordingly, to increase a breakdown voltage of the parasitic diode PDa against the surge voltage, it is preferred that the device 100, 101 has the following structure.

FIGS. 2A, 2B, 3, 4A and 4B show semiconductor devices 102-106 having various fifth semiconductor regions 6b-6f. Each semiconductor device 102-106 is similar to the device 100 shown in FIG. 1A except for the fifth semiconductor region 6.

In the device 102 in FIG. 2A, the fifth semiconductor region 6b has an impurity concentration lower than the third semiconductor region 4, although the fifth semiconductor region 6 in the device 100 in FIG. 1A has the same impurity concentration as the third semiconductor region 4. Thus, the resistance of carriers passing through the fifth semiconductor region 6b increases, so that the current concentration is reduced. Accordingly, the breakdown voltage against the surge is improved, i.e., increased.

In the device 103 in FIG. 2B, the fifth semiconductor region 6c has a depth shallower than the third semiconductor region 4, although the fifth semiconductor region 6 in the device 100 has the same depth as the third semiconductor region 4. Thus, the resistance of carriers passing through the fifth semiconductor region 6c increases, so that the current concentration is reduced. Accordingly, the breakdown voltage against the surge is improved.

In the device 104 in FIG. 3, the fifth semiconductor region 6d is composed of multiple diffusion regions, which are overlapped each other and adjacent to each other, although the fifth semiconductor region 6 in the device 100 is formed from one diffusion region. Thus, the resistance of the fifth semiconductor region 6d is increased at the overlapping portion of the diffusion regions. Thus, the resistance of carriers passing through the fifth semiconductor region 6d increases, so that the current concentration is reduced. Accordingly, the breakdown voltage against the surge is improved.

In each device 105, 106 in FIGS. 4A and 4B, the fifth semiconductor region 5e, 5f includes a trench te, tf having an insulation film therein. Specifically, the trench te of the device 105 penetrates the fifth semiconductor region 6e, and is disposed in a part of the fifth semiconductor region 6e. The trench tf of the device 106 does not penetrates the fifth semiconductor region 6f, i.e., the bottom of the trench tf does not reach the substrate 1 so that the bottom of the trench tf remains in the fifth semiconductor region 6f. In the device 100, the fifth semiconductor region 6 has no trench. Thus, the resistance of carriers passing through the fifth semiconductor region 6e, 6f increases, so that the current concentration is reduced. Accordingly, the breakdown voltage against the surge is improved.

Figure 5:
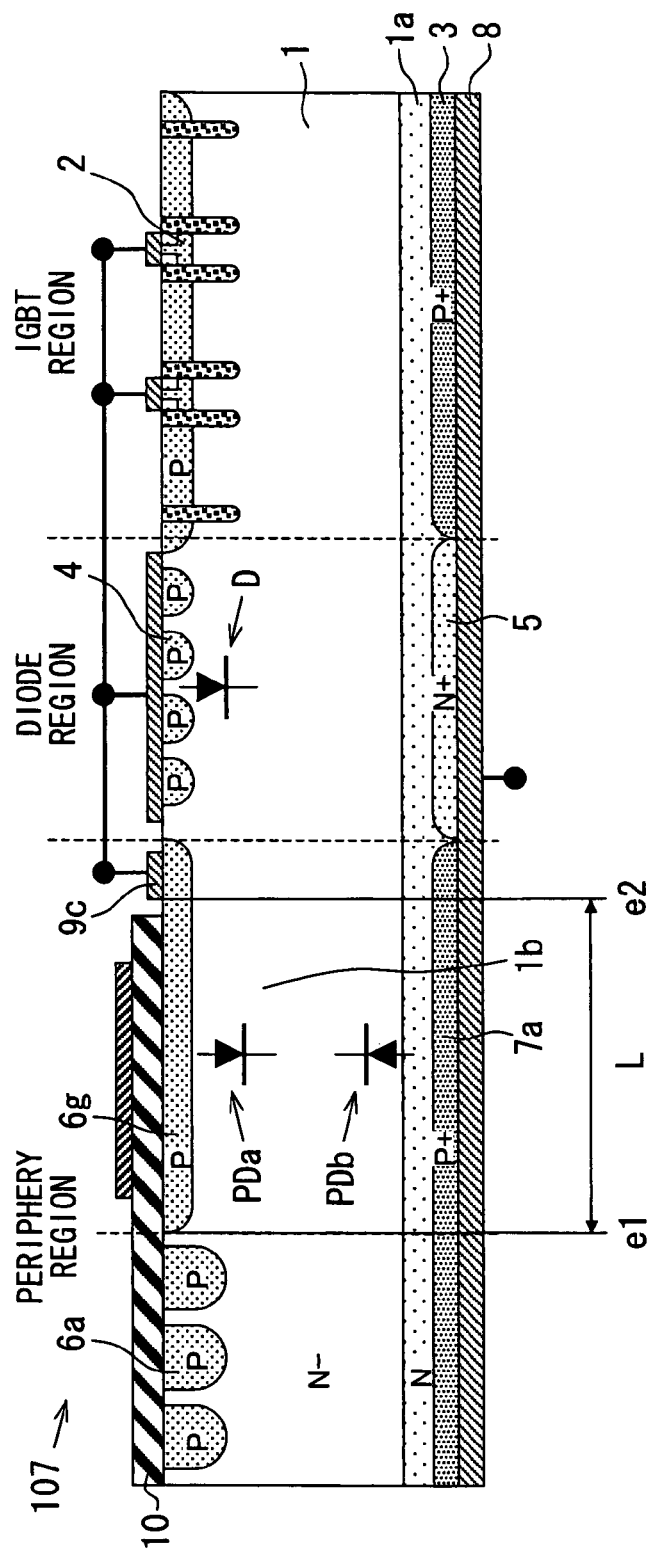
FIG. 5 is a cross sectional view showing a semiconductor device according to further another example embodiment of the present disclosure.

FIG. 5 shows a semiconductor device 107, in which the dimensions of the fifth semiconductor region 6g are specified. In the device 107, the seventh semiconductor region 6a having the P conductive type is formed on the principal surface of the substrate 1. The first, third and fifth semiconductor regions 2, 4, 6 are surrounded with the seventh semiconductor region 6a. The fifth semiconductor region 6g has one end e1 disposed on the seventh semiconductor region side, and the electrode 9c has one end e2 disposed on the periphery region side. The electrode 9c is connected to the fifth semiconductor region 6g. The distance between the one end e1 of the fifth semiconductor region 6g and the one end e2 of the electrode 9c is defined as L, which is longer than a diffusion length of the hole in an eight semiconductor region 1b of the substrate 1. For example, the distance L is predetermined to be equal to or longer than 50 μm. Preferably, the distance L may be equal to or longer than 100 μm.

Since the device 107 includes the seventh semiconductor region 6a, the depletion layer expands to the periphery region when the diode is in the interception state. Accordingly, the electric field concentration is reduced. Further, since the distance L is longer than the diffusion length of the hole, the current concentration is also reduced. Thus, breakdown at the one end e2, at which the fifth semiconductor region 6g is connected to the electrode 9c, is also reduced.

FIG. 10A shows a semiconductor device 109, in which an insulation layer 20 is disposed on the backside of the substrate 1. Specifically, the insulation layer 20 is disposed in the periphery region, and the backside electrode 8 is disposed on the backside of the substrate 1 in the diode region and the IGBT region. Here, the N conductive type semiconductor layer 1a provides a field stop layer (i.e., FS layer). Compared with the device 100 in FIG. 1A, the device 109 has no fourth semiconductor region 5 and the sixth semiconductor region 7a. However, since the device 109 includes the insulation layer 20, the operation of the parasitic diode PDa is limited, and the hole introduction into the substrate 1 under the fifth semiconductor region 6 in case of the forward operation is reduced. Thus, the recovery characteristics of the regular diode D in case of the reverse operation are improved.

FIG. 10B shows a semiconductor device 110, in which the insulation layer 20 is disposed on the backside of the substrate 1. Specifically, the insulation layer 20 is disposed in the periphery region, and the backside electrode 8 is disposed on the backside of the substrate 1 in the diode region and the IGBT region. Compared with the device 100 in FIG. 1A, the device 109 has no fourth semiconductor region 5 and the sixth semiconductor region 7a. Further, in the periphery region, the N conductive type semiconductor layer 1a is only disposed partially. Mainly, there is no field stop layer (i.e., corresponding to the N conductive type semiconductor region 1a) in the periphery region. However, since the device 109 includes the insulation layer 20, the operation of the parasitic diode PDa is limited, and the hole introduction into the substrate 1 under the fifth semiconductor region 6 in case of the forward operation is reduced. Thus, the recovery characteristics of the regular diode D in case of the reverse operation are improved.

FIG. 10C shows a semiconductor device 111, in which a high resistance layer 21 is disposed on the backside of the substrate 1 between the N conductive type semiconductor layer 1a and the backside electrode 8. Specifically, the high resistance layer 21 is disposed in the periphery region only, and the backside electrode 8 is disposed on the backside of the substrate 1 not only in the diode region and the IGBT region but also in the periphery region. Compared with the device 100 in FIG. 1A, the device 111 has no fourth semiconductor region 5 and the sixth semiconductor region 7a. However, since the device 111 includes the high resistance layer 21, the operation of the parasitic diode PDa is limited, and the hole introduction into the substrate 1 under the fifth semiconductor region 6 in case of the forward operation is reduced. Thus, the recovery characteristics of the regular diode D in case of the reverse operation are improved. Here, the high resistance layer 21 is prepared by increasing a contact resistance to the backside electrode 8 or by decreasing an impurity concentration at a boundary between the backside electrode and the N conductive type semiconductor layer 1a.

FIG. 10D shows a semiconductor device 112. Specifically, the backside electrode 8 is only disposed in the diode region and the IGBT region. Thus, there is no backside electrode 8 in the periphery region. Further, compared with the device 100 in FIG. 1A, the device 112 has no fourth semiconductor region 5 and the sixth semiconductor region 7a. However, since the periphery region has no backside electrode 8, the operation of the parasitic diode PDa is limited, and the hole introduction into the substrate 1 under the fifth semiconductor region 6 in case of the forward operation is reduced. Thus, the recovery characteristics of the regular diode D in case of the reverse operation are improved.

Figure 6:
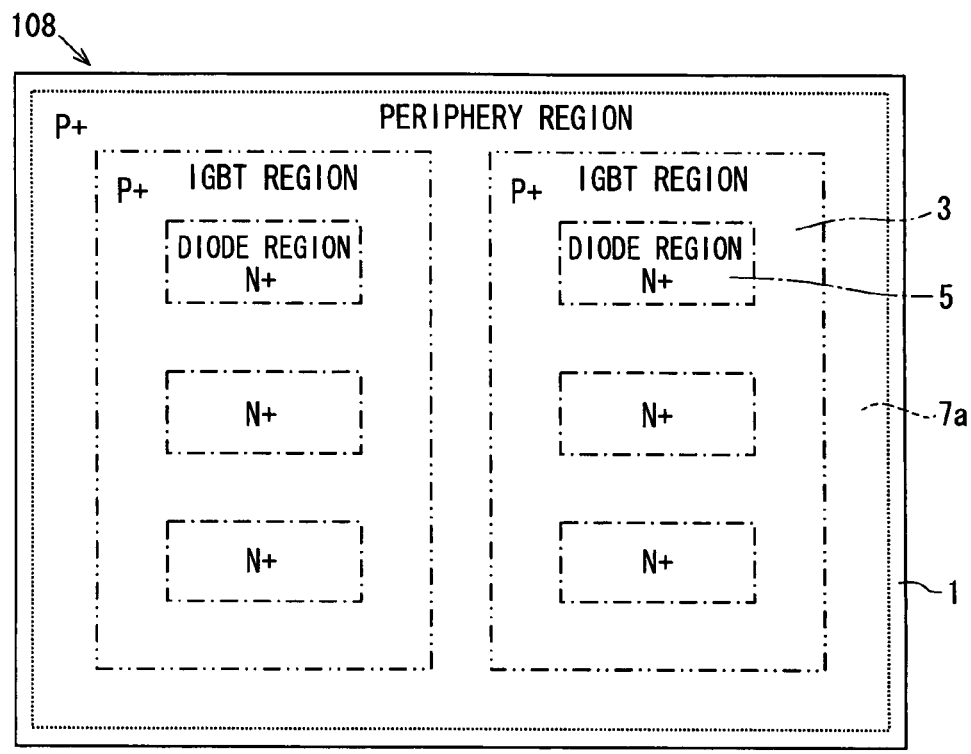
FIG. 6 is a bottom view showing a semiconductor device according to another example embodiment of the present disclosure.
Figure 7:
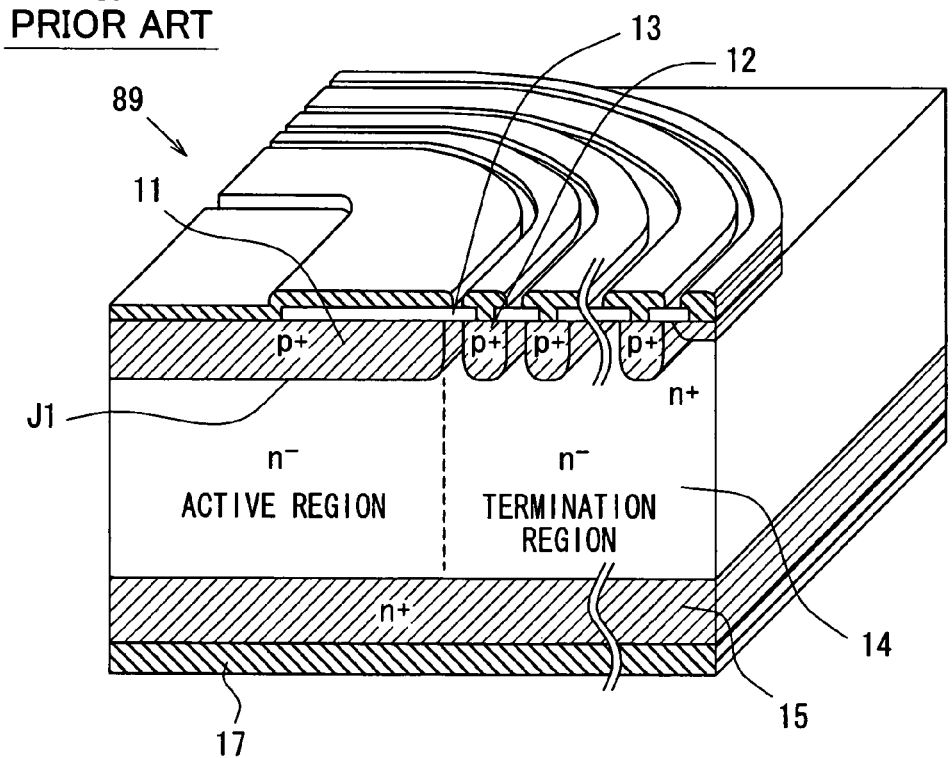
FIG. 7 is a perspective view showing a semiconductor device according to a prior art.
Figure 8:
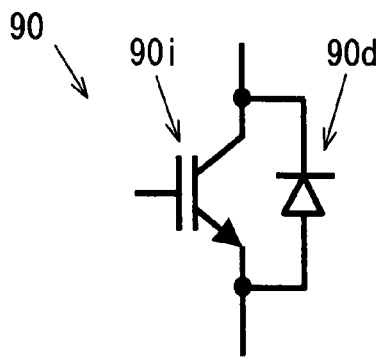
FIG. 8 is an equivalent circuit diagram showing the device in FIG. 7.
Figure 9A:
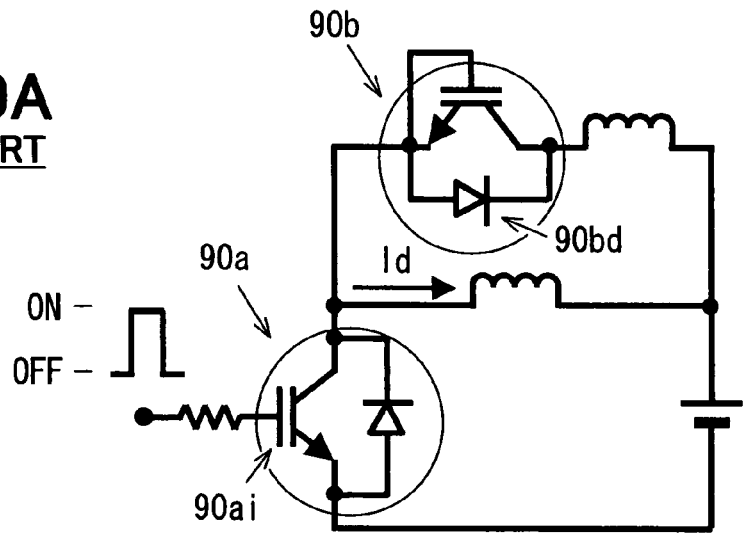
FIG. 9A is a circuit diagram showing an evaluation circuit for measuring a current waveform in the device.
Figure 9B:
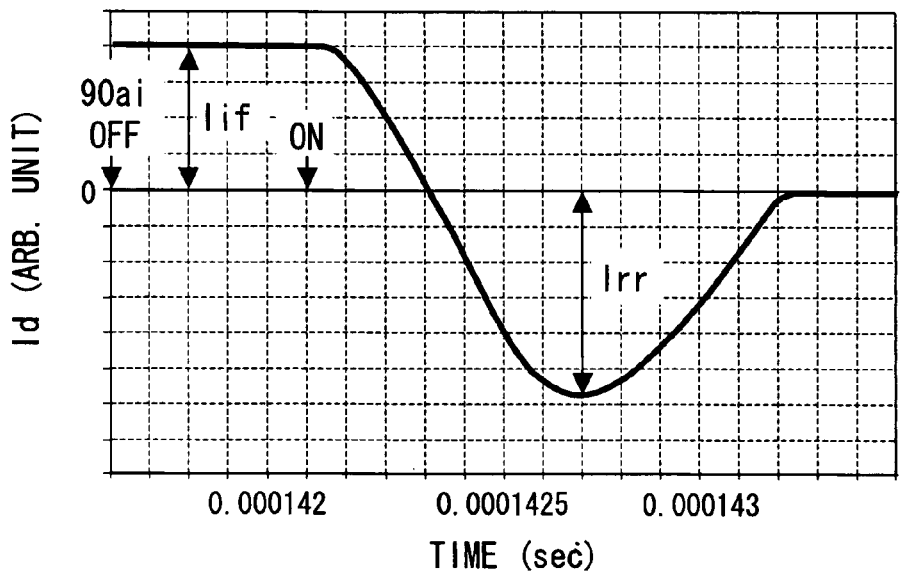
FIG. 9B is an example graph showing a current waveform in the device.

FIG. 6 shows a semiconductor device 108, and the device 108 has a cross sectional structure, similar to the device 100 shown in FIG. 1A.

The device 108 includes an IGBT and a diode, which are formed in the substrate 1 having the N⁻ conductive type. In the IGBT region of the device 108, as shown in FIG. 1A, the first semiconductor region 2 having the P conductive type is formed in the surface portion of the principal surface of the substrate 1. The first semiconductor region 2 provides the channel forming region of the IGBT. The second semiconductor region 3 having the P⁺ conductive type is formed in the surface portion of the backside surface of the substrate 1. The second semiconductor region 3 faces the first semiconductor region 2, and provides the collector region of the IGBT. The second semiconductor region 3 is disposed in the IGBT region, and shown as a region surrounded with a dashed-dotted line and a dashed-two dotted line in FIG. 6.

In the diode region of the device 108, as shown in FIG. 1A, the third semiconductor region 4 having the P conductive type is formed in the surface portion of the principal surface of the substrate 1. The third semiconductor region 4 provides the anode region of the diode. The fourth semiconductor region 5 having the N⁺ conductive type is formed in the surface portion of the backside surface of the substrate 1. The fourth semiconductor region 5 faces the third semiconductor region 4, and provides the cathode region of the diode. The fourth semiconductor region 5 is disposed in the diode region. The fourth semiconductor region 5 of the device 108 is shown as a region surrounded with the dashed-dotted line in FIG. 6.

Thus, in the device 108, the IGBT region (i.e., shown as the second semiconductor region 3) surrounds the diode region (i.e., shown as the fourth semiconductor region 5), as shown in FIG. 6.

A region disposed outside of the dashed-two dotted line in FIG. 6 corresponds to a region other than the IGBT region and the diode region of the device 108, and surrounds the IGBT region. The fifth semiconductor region 6 is formed in the surface portion of the principal surface of the substrate 1 in this region outside of the dashed-two dotted line, as shown in FIG. 1A. Accordingly, in the device 108, the fifth semiconductor region 6 surrounds the IGBT region (i.e., corresponding to the second semiconductor region 3). Here, the first, third and fifth semiconductor regions 2, 4, 6 are electrically coupled with each other mutually.

In the device 108, the sixth semiconductor region 7a facing the fifth semiconductor region 6 is disposed on whole of the surface portion of the backside surface other than the second and fourth semiconductor regions 3, 5. The second, fourth and sixth semiconductor regions 3, 5, 7a are electrically and mutually coupled with a backside electrode 8.

The fifth semiconductor region 6 is disposed under the gate wiring 9a and the pad electrode 9b, and has the P conductive type. Accordingly, the PN junction is formed between the substrate 1 having the N conductive type and the fifth semiconductor region 6 so that the breakdown voltage of the device is improved. However, this fifth semiconductor region 6 is electrically and mutually coupled with the first and third semiconductor regions 2, 4. Thus, the parasitic diode PDa between the fifth semiconductor region 6 and the substrate 1 may reduce the recovery characteristics of the regular diode D in case of the reverse operation. Thus, in the device 108, the fifth semiconductor region 6 and the regular diode region (i.e., corresponding to the fourth semiconductor region 5) sandwich the IGBT region (i.e., corresponding to the second semiconductor region 3), and are separated each other. Thus, in case of the forward operation of the diode D, the hole is introduced into the substrate 1 under the fifth semiconductor region 6. However, the influence to the recovery characteristics of the diode D by the introduced hole is reduced in case of the reverse operation of the diode D.

In the region other than the IGBT region and the diode region of the device 108, the fifth semiconductor region 6 having the P conductive type is formed on the principal surface of the substrate 1, and the sixth semiconductor region 7a having the P$^+$ conductive type and facing the fifth semiconductor region 6 is formed on the backside surface of the substrate 1. To improve the recovery characteristics of the diode D, it is preferred that the sixth semiconductor region 7a has the P conductive type. Alternatively, in the device 108, since the diode region and the fifth semiconductor region 6 are separated each other with sandwiching the IGBT region therebetween, the sixth semiconductor region may have the N conductive type as long as the diode region and the fifth semiconductor region 6 are separated sufficiently. In this device 108, the recovery characteristics of the regular diode D in case of the reverse operation are improved. Further, the breakdown voltage against the surge is improved.

Figure 11A:
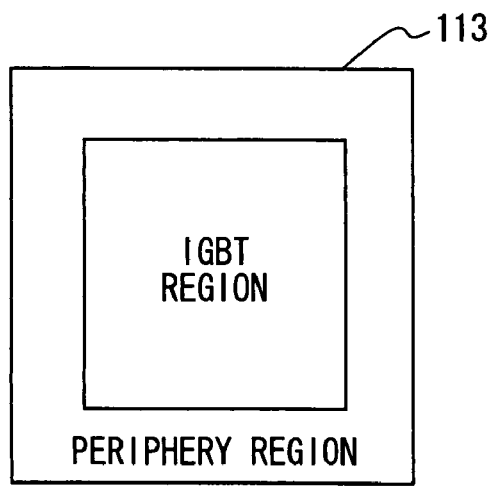
FIG. 11A is a top view and FIG. 11B is a bottom view showing a semiconductor device according to another example embodiment of the present disclosure.
Figure 11B:
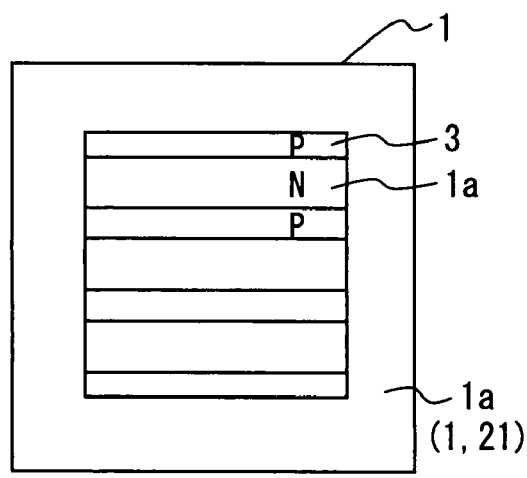

FIG. 11A shows the principal surface of a semiconductor device 113, and FIG. 11B shows the backside surface of the device 113. The IGBT region and the diode region of the device 113 are commonly formed in the same area. Here, the device 113 has a cross section similar to the devices 109-112 in FIGS. 10A-10D. Specifically, the surface portion of the backside surface of the substrate 1 in the periphery region includes the insulation layer 20 with the field stop layer 1a, the insulation layer 20 without the field stop layer 1a, the high resistance layer 21 between the field stop layer 1a and the backside electrode 8, or only the field stop layer without the backside electrode 8. In this device 113, the recovery characteristics of the regular diode D in case of the reverse operation are improved, and the breakdown voltage against the surge is improved.

Figure 12A:
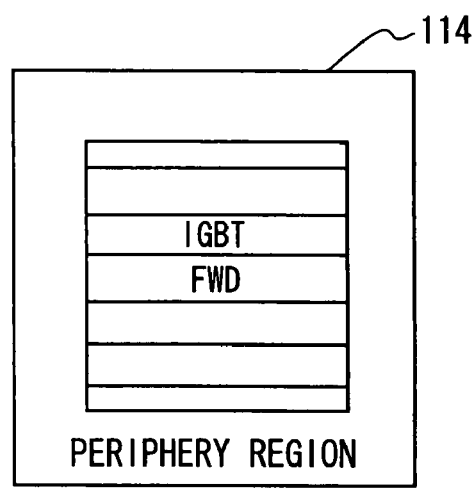
FIG. 12A is a top view and FIG. 12B is a bottom view showing a semiconductor device according to another example embodiment of the present disclosure.
Figure 12B:
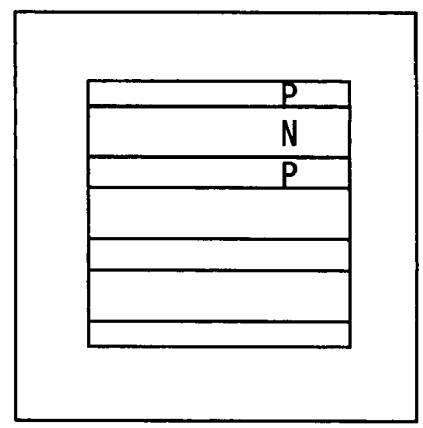

FIG. 12A shows the principal surface of a semiconductor device 114, and FIG. 12B shows the backside surface of the device 114. The IGBT region and the diode region of the device 114 are separately formed. The IGBT region and the diode region are alternately disposed along with one direction of the substrate 1, which is parallel to the principal surface of the substrate 1. Here, the device 114 has a cross section similar to the devices 109-112 in FIGS. 10A-10D. Specifically, the surface portion of the backside surface of the substrate 1 in the periphery region includes the insulation layer 20 with the field stop layer 1a, the insulation layer 20 without the field stop layer 1a, the high resistance layer 21 between the field stop layer 1a and the backside electrode 8, or only the field stop layer without the backside electrode 8. In this device 114, the recovery characteristics of the regular diode D in case of the reverse operation are improved, and the breakdown voltage against the surge is improved.

Figure 13A:
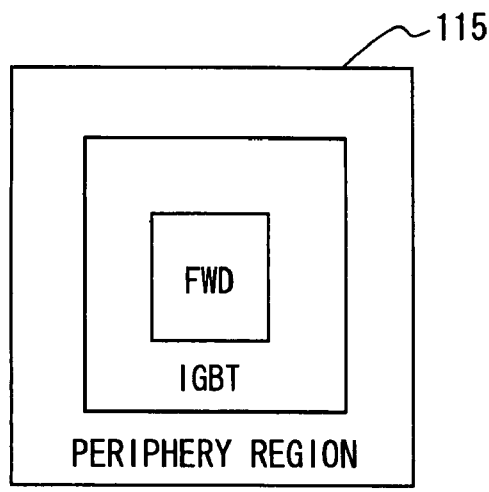
FIG. 13A is a top view and FIG. 13B is a bottom view showing a semiconductor device according to another example embodiment of the present disclosure.
Figure 13B:
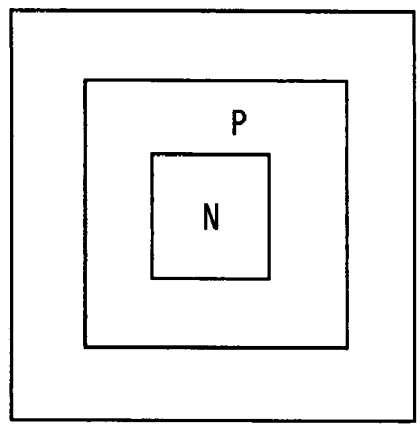

FIG. 13A shows the principal surface of a semiconductor device 115, and FIG. 13B shows the backside surface of the device 115. The IGBT region and the diode region of the device 115 are separately formed. The periphery region surrounds the IGBT region, and the IGBT region surrounds the diode region. Here, the device 115 has a cross section similar to the devices 109-112 in FIGS. 10A-10D. Specifically, the surface portion of the backside surface of the substrate 1 in the periphery region includes the insulation layer 20 with the field stop layer 1a, the insulation layer 20 without the field stop layer 1a, the high resistance layer 21 between the field stop layer 1a and the backside electrode 8, or only the field stop layer without the backside electrode 8. In this device 115, the recovery characteristics of the regular diode D in case of the reverse operation are improved, and the breakdown voltage against the surge is improved.

Figure 14A:
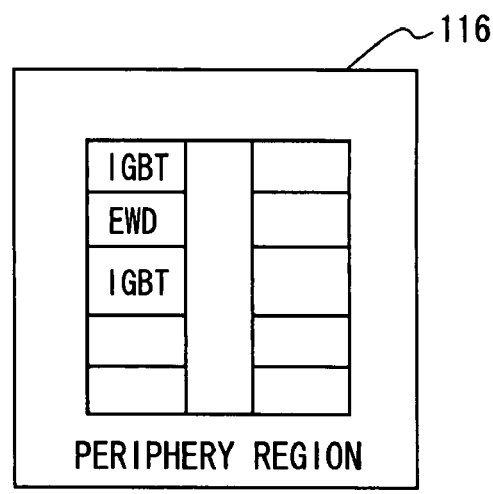
FIG. 14A is a top view and FIG. 14B is a bottom view showing a semiconductor device according to another example embodiment of the present disclosure.
Figure 14B:
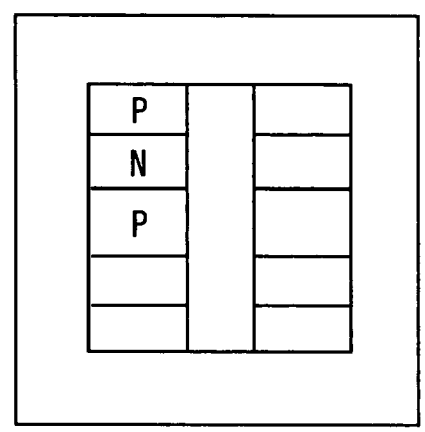

FIG. 14A shows the principal surface of a semiconductor device 116, and FIG. 14B shows the backside surface of the device 116. The IGBT region and the diode region of the device 116 are separately formed. The periphery region surrounds the IGBT region and the diode region. Further, The IGBT region and the diode region are alternately disposed along with one direction of the substrate 1, which is parallel to the principal surface of the substrate 1. Furthermore, the periphery region includes a middle portion, which divides the IGBT region and the diode region into two parts. Here, the device 116 has a cross section similar to the devices 109-112 in FIGS. 10A-10D. Specifically, the surface portion of the backside surface of the substrate 1 in the periphery region includes the insulation layer 20 with the field stop layer 1a, the insulation layer 20 without the field stop layer 1a, the high resistance layer 21 between the field stop layer 1a and the backside electrode 8, or only the field stop layer without the backside electrode 8. In this device 116, the recovery characteristics of the regular diode D in case of the reverse operation are improved, and the breakdown voltage against the surge is improved.

In each device 100-116, the substrate 1 has the N conductive type, the IGBT is a N channel IGBT with the first semiconductor region 2 having the P conductive type as the channel forming region, and the diode has the third semiconductor region 4 having the P conductive type as the anode. Alternatively, the substrate 1 may have the P conductive type, the IGBT may be a P channel IGBT with the first semiconductor region 2 having the N conductive type as the channel forming region, and the diode may have the third semiconductor region 4 having the N conductive type as the cathode. In this case, the recovery characteristics of the regular diode D in case of the reverse operation are improved. Further, the breakdown voltage against the surge is improved.

The above disclosure has the following aspects.

According to a first aspect of the present disclosure, a semiconductor device includes: a semiconductor substrate having a first conductive type and first and second surfaces; an IGBT region having an IGBT and disposed in the substrate; a diode region having a diode and disposed in the substrate; and a periphery region disposed in the substrate. The IGBT region includes: a first semiconductor region having a second conductive type an d disposed in a surface portion of the first surface of the substrate, the first semiconductor region providing a channel-forming region of the IGBT; and a second semiconductor region having the second conductive type and disposed in a surface portion of the second surface of the substrate, the second semiconductor region facing the first semiconductor region and providing a collector of the IGBT. The diode region includes: a third semiconductor region having the second conductive type and disposed in a surface portion of the first surface of the substrate, the third semiconductor region providing one of an anode and a cathode of the diode; and a fourth semiconductor region having the first conductive type and disposed in a surface portion of the second surface of the substrate, the fourth semiconductor region facing the first semiconductor region and providing the other one of the anode and the cathode of the diode. The periphery region includes: a fifth semiconductor region having the second conductive type and disposed in a surface portion of the first surface of the substrate; and a sixth semiconductor region having the second conductive type and disposed in a surface portion of the second surface of the substrate, the sixth semiconductor region facing the fifth semiconductor region. The first, third and fifth semiconductor regions are commonly and electrically coupled with one another, and the second, fourth and sixth semiconductor regions are commonly and electrically coupled with one another.

In the above device, the sixth semiconductor region is disposed on the second surface of the substrate and faces the fifth semiconductor region. Thus, the parasitic diode around the sixth semiconductor region is oppositely disposed to the parasitic diode around the fifth semiconductor region. Thus, the influence of the parasitic diode around the fifth semiconductor region is reduced so that the hole is prevented from introducing into the substrate under the fifth semiconductor region in case of a forward operation. Accordingly, the recovery characteristics of the regular diode are improved in case of a reverse operation.

Alternatively, the device may further include a backside electrode disposed on the second surface of the substrate. The backside electrode is disposed in the periphery region, the diode region and the IGBT region so that the second, fourth and sixth semiconductor regions are commonly and electrically coupled with the backside electrode.

Alternatively, the device may further include a seventh semiconductor region having the second conductive type and disposed in a surface portion of the first surface of the substrate. The seventh semiconductor region surrounds the first, third and fifth semiconductor regions. The fifth semiconductor region has one end near the seventh semiconductor region. The periphery region further includes an electrode disposed on the fifth semiconductor region. The electrode has one end near the seventh semiconductor region. A distance between the one end of the fifth semiconductor region and the one end of the electrode is equal to or longer than a diffusion length of a hole in the substrate between the fifth semiconductor region and the sixth semiconductor region. In this case, a depletion layer expands in the periphery region when the diode is in the interception state, so that an electric field concentration is reduced. Further, since the distance between the one end of the fifth semiconductor region and the one end of the electrode is equal to or longer than the diffusion length of the hole, a current concentration is reduced, so that a breakdown at the one end of the electrode is prevented.

Alternatively, the sixth semiconductor region may be only disposed under the fifth semiconductor region. Alternatively, the sixth semiconductor region may be disposed on a whole of the second surface of the substrate other than the surface portion of the second semiconductor region and the surface portion of the fourth semiconductor region. Alternatively, the IGBT region may surround the diode region, and the fifth semiconductor region in the periphery region may surround the IGBT region.

According to a second aspect of the present disclosure, a semiconductor device includes: a semiconductor substrate having a first conductive type and first and second surfaces; an IGBT region having an IGBT and disposed in the substrate; a diode region having a diode and disposed in the substrate; and a periphery region disposed in the substrate. The IGBT region includes: a first semiconductor region having a second conductive type and disposed in a surface portion of the first surface of the substrate, the first semiconductor region providing a channel-forming region of the IGBT; and a second semiconductor region having the second conductive type and disposed in a surface portion of the second surface of the substrate, the second semiconductor region facing the first semiconductor region and providing a collector of the IGBT. The diode region includes: a third semiconductor region having the second conductive type and disposed in a surface portion of the first surface of the substrate, the third semiconductor region providing one of an anode and a cathode of the diode; and a fourth semiconductor region having the first conductive type and disposed in a surface portion of the second surface of the substrate, the fourth semiconductor region facing the first semiconductor region and providing the other one of the anode and the cathode of the diode. The periphery region includes a fifth semiconductor region having the second conductive type and disposed in a surface portion of the first surface of the substrate. The IGBT region is disposed between the periphery region and the diode region. The first, third and fifth semiconductor regions are commonly and electrically coupled with one another, and the second and fourth semiconductor regions are commonly and electrically coupled with one another.

In the above device, the IGBT region is disposed between the periphery region and the diode region. Thus, even when the hole is introduced into the substrate under the fifth semiconductor region in case of a forward operation, the influence of the hole to the recovery characteristics of the diode is reduced in case of a reverse operation.

Alternatively, the IGBT region may surround the diode region, and the fifth semiconductor region in the periphery region may surround the IGBT region.

Alternatively, the device may further include a backside electrode disposed on the second surface of the substrate; and an insulation layer disposed on the second surface of the substrate. The backside electrode is disposed in the diode region and the IGBT region so that the second and fourth semiconductor regions are commonly and electrically coupled with each other, and the insulation layer is disposed in the periphery region.

Alternatively, the device may further include a backside electrode disposed on the second surface of the substrate. The backside electrode is disposed in the diode region and the IGBT region so that the second and fourth semiconductor regions are commonly and electrically coupled with each other, and the backside electrode is not disposed in the periphery region.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a semiconductor substrate having a first conductive type and first and second surfaces;
   an IGBT region having an IGBT and disposed in the substrate;
   a diode region having a diode and disposed in the substrate; and
   a periphery region disposed in the substrate, wherein
   the IGBT region includes:
      a first semiconductor region having a second conductive type and disposed in a surface portion of the first surface of the substrate, the first semiconductor region providing a channel-forming region of the IGBT; and
      a second semiconductor region having the second conductive type and disposed in a surface portion of the second surface of the substrate, the second semiconductor region facing the first semiconductor region and providing a collector of the IGBT,
   the diode region includes:
      a third semiconductor region having the second conductive type and disposed in a surface portion of the first surface of the substrate, the third semiconductor region providing one of an anode and a cathode of the diode; and
      a fourth semiconductor region having the first conductive type and disposed in a surface portion of the second surface of the substrate, the fourth semiconductor region facing the third semiconductor region and providing the other one of the anode and the cathode of the diode,
   the periphery region includes:
      a fifth semiconductor region having the second conductive type and disposed in a surface portion of the first surface of the substrate; and
      a sixth semiconductor region having the second conductive type and disposed in a surface portion of the second surface of the substrate, the sixth semiconductor region facing the fifth semiconductor region,
   the first, third and fifth semiconductor regions are commonly and electrically coupled with one another,
   the second, fourth and sixth semiconductor regions are commonly and electrically coupled with one another,
   the IGBT region is separated from the diode region,
   the second semiconductor region covers a whole of the second surface in the IGBT region,
   the fourth semiconductor region covers a whole of the second surface in the diode region,
   the fifth semiconductor region has a projection area projected onto the second surface, an outline of the projection area being coincident with or covered with the sixth semiconductor region,
   the second semiconductor region does not abut the sixth semiconductor region, and
   the sixth semiconductor region is disposed on a whole of the second surface of the substrate other than the surface portion of the second semiconductor region and the surface portion of the fourth semiconductor region.

2. The device according to claim 1, wherein
   the first conductive type is a N conductive type, and the second conductive type is a P conductive type, and
   the third semiconductor region provides the anode of the diode, and
   the fourth semiconductor region provides the cathode of the diode.

3. The device according to claim 1, wherein
   the first conductive type is a P conductive type, and the second conductive type is a N conductive type, and
   the third semiconductor region provides the cathode of the diode, and
   the fourth semiconductor region provides the anode of the diode.

4. The device according to claim 1, further comprising:
   a backside electrode disposed on the second surface of the substrate, wherein
   the backside electrode is disposed in the periphery region, the diode region and the IGBT region so that the second, fourth and sixth semiconductor regions are commonly and electrically coupled with the backside electrode.

5. The device according to claim 1, further comprising:
   a seventh semiconductor region having the second conductive type and disposed in a surface portion of the first surface of the substrate, wherein
   the seventh semiconductor region surrounds the first, third and fifth semiconductor regions,
   the fifth semiconductor region has one end near the seventh semiconductor region,
   the periphery region further includes an electrode disposed on the fifth semiconductor region,
   the electrode has one end near the seventh semiconductor region, and
   a distance between the one end of the fifth semiconductor region and the one end of the electrode is equal to or longer than a diffusion length of a hole in the substrate between the fifth semiconductor region and the sixth semiconductor region.

6. The device according to claim 1, wherein
   the sixth semiconductor region is only disposed under the fifth semiconductor region.

7. The device according to claim 1, wherein
   the IGBT region surrounds the diode region, and
   the fifth semiconductor region in the periphery region surrounds the IGBT region.

8. The device according to claim 1, wherein
   the fifth semiconductor region has an impurity concentration lower than an impurity concentration of the third semiconductor region.

9. The device according to claim 1, wherein
   the fifth semiconductor region has a depth in a direction perpendicular to the first surface of the substrate, and
   the depth of the fifth semiconductor region is shallower than a depth of the third semiconductor region.

10. The device according to claim 1, wherein
    the fifth semiconductor region includes a plurality of diffusion regions, and
    adjacent two of the diffusion regions are partially overlapped each other so that the diffusion regions are connected together.

11. The device according to claim 1, wherein
    the fifth semiconductor region includes an insulation film in a trench.

12. The device according to claim 1, wherein
the periphery region further includes a gate wiring for the IGBT, and
the gate wiring is disposed on the fifth semiconductor region with an insulation film between the gate wiring and the fifth semiconductor region.

13. The device according to claim 1, wherein
the periphery region further includes a pad electrode, and
the pad is disposed on the fifth semiconductor region with an insulation film between the pad electrode and the fifth semiconductor region.

14. A semiconductor device comprising:
a semiconductor substrate having a first conductive type and first and second surfaces;
an IGBT region having an IGBT and disposed in the substrate;
a diode region having a diode and disposed in the substrate; and
a periphery region disposed in the substrate, wherein
the IGBT region includes:
   a first semiconductor region having a second conductive type and disposed in a surface portion of the first surface of the substrate, the first semiconductor region providing a channel-forming region of the IGBT; and
   a second semiconductor region having the second conductive type and disposed in a surface portion of the second surface of the substrate, the second semiconductor region facing the first semiconductor region and providing a collector of the IGBT,
the diode region includes:
   a third semiconductor region having the second conductive type and disposed in a surface portion of the first surface of the substrate, the third semiconductor region providing one of an anode and a cathode of the diode; and
   a fourth semiconductor region having the first conductive type and disposed in a surface portion of the second surface of the substrate, the fourth semiconductor region facing the third semiconductor region and providing the other one of the anode and the cathode of the diode,
the periphery region includes a fifth semiconductor region having the second conductive type and disposed in a surface portion of the first surface of the substrate,
the IGBT region is disposed between the periphery region and the diode region,
the IGBT region is separated from the diode region,
the first, third and fifth semiconductor regions are commonly and electrically coupled with one another,
the second and fourth semiconductor regions are commonly and electrically coupled with one another
the second semiconductor region covers a whole of the second surface in the IGBT region,
the fourth semiconductor region covers a whole of the second surface in the diode region,
the IGBT region surrounds the entirety of the diode region, and
the fifth semiconductor region in the periphery region surrounds the IGBT region.

15. The device according to claim 14, wherein
the first conductive type is a N conductive type, and the second conductive type is a P conductive type, and
the third semiconductor region provides the anode of the diode, and
the fourth semiconductor region provides the cathode of the diode.

16. The device according to claim 14, wherein
the first conductive type is a P conductive type, and the second conductive type is a N conductive type, and
the third semiconductor region provides the cathode of the diode, and
the fourth semiconductor region provides the anode of the diode.

17. The device according to claim 14, further comprising:
a seventh semiconductor region having the second conductive type and disposed in a surface portion of the first surface of the substrate, wherein
the seventh semiconductor region surrounds the first, third and fifth semiconductor regions,
the fifth semiconductor region has one end near the seventh semiconductor region,
the periphery region further includes an electrode disposed on the fifth semiconductor region,
the electrode has one end near the seventh semiconductor region, and
a distance between the one end of the fifth semiconductor region and the one end of the electrode is equal to or longer than a diffusion length of a hole in the substrate under the fifth semiconductor region.

18. The device according to claim 14, further comprising:
a backside electrode disposed on the second surface of the substrate; and
an insulation layer disposed on the second surface of the substrate, wherein
the backside electrode is disposed in the diode region and the IGBT region so that the second and fourth semiconductor regions are commonly and electrically coupled with each other, and
the insulation layer is disposed in the periphery region.

19. The device according to claim 14, further comprising:
a backside electrode disposed on the second surface of the substrate, wherein
the backside electrode is disposed in the diode region and the IGBT region so that the second and fourth semiconductor regions are commonly and electrically coupled with each other, and
the backside electrode is not disposed in the periphery region.

20. The device according to claim 14, further comprising:
a backside electrode disposed on the second surface of the substrate; and
a high resistance layer disposed in the periphery region, wherein
the backside electrode is disposed in the periphery region, diode region and the IGBT region so that the second and fourth semiconductor regions are commonly and electrically coupled with each other, and
the high resistance layer is disposed between the substrate and the backside electrode.

21. The device according to claim 14, wherein
the fifth semiconductor region has an impurity concentration lower than an impurity concentration of the third semiconductor region.

22. The device according to claim 14, wherein
the fifth semiconductor region has a depth in a direction perpendicular to the first surface of the substrate, and
the depth of the fifth semiconductor region is shallower than a depth of the third semiconductor region.

23. The device according to claim 14, wherein
the fifth semiconductor region includes a plurality of diffusion regions, and adjacent two of the diffusion regions are partially overlapped each other so that the diffusion regions are connected together.

24. The device according to claim 14, wherein the fifth semiconductor region includes an insulation film in a trench.

25. The device according to claim 14, wherein the periphery region further includes a gate wiring for the IGBT, and
the gate wiring is disposed on the fifth semiconductor region with an insulation film between the gate wiring and the fifth semiconductor region.

26. The device according to claim 14, wherein the periphery region further includes a pad electrode, and
the pad is disposed on the fifth semiconductor region with an insulation film between the pad electrode and the fifth semiconductor region.

27. A semiconductor device comprising:
a semiconductor substrate having a first conductive type and first and second surfaces;
an IGBT region having an IGBT and disposed in the substrate;
a diode region having a diode and disposed in the substrate; and
a periphery region disposed in the substrate, wherein
the IGBT region includes:
a first semiconductor region having a second conductive type and disposed in a surface portion of the first surface of the substrate, the first semiconductor region providing a channel-forming region of the IGBT; and
a second semiconductor region having the second conductive type and disposed in a surface portion of the second surface of the substrate, the second semiconductor region facing the first semiconductor region and providing a collector of the IGBT,
the diode region includes:
a third semiconductor region having the second conductive type and disposed in a surface portion of the first surface of the substrate, the third semiconductor region providing one of an anode and a cathode of the diode; and
a fourth semiconductor region having the first conductive type and disposed in a surface portion of the second surface of the substrate, the fourth semiconductor region facing the third semiconductor region and providing the other one of the anode and the cathode of the diode,
the periphery region includes:
a fifth semiconductor region having the second conductive type and disposed in a surface portion of the first surface of the substrate; and
a sixth semiconductor region having the second conductive type and disposed in a surface portion of the second surface of the substrate, the sixth semiconductor region facing the fifth semiconductor region,
the first, third and fifth semiconductor regions are commonly and electrically coupled with one another,
the second, fourth and sixth semiconductor regions are commonly and electrically coupled with one another,
the IGBT region is separated from the diode region,
the second semiconductor region covers a whole of the second surface in the IGBT region,
the fourth semiconductor region covers a whole of the second surface in the diode region,
the fifth semiconductor region is only disposed directly above the sixth semiconductor region,
the second semiconductor region does not abut the sixth semiconductor region, and
the sixth semiconductor region is disposed on a whole of the second surface of the substrate other than the surface portion of the second semiconductor region and the surface portion of the fourth semiconductor region.

* * * * *